United States Patent
Ichiryu et al.

(10) Patent No.: US 9,330,811 B2
(45) Date of Patent: May 3, 2016

(54) TRANSPARENT ELECTRODE AND METHOD FOR MANUFACTURING THE SAME

(71) Applicant: PANASONIC INTELLECTUAL PROPERTY MANAGEMENT CO., LTD, Osaka (JP)

(72) Inventors: Takashi Ichiryu, Osaka (JP); Yoshihisa Yamashita, Kyoto (JP); Seiichi Nakatani, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 149 days.

(21) Appl. No.: 14/232,070

(22) PCT Filed: May 17, 2013

(86) PCT No.: PCT/JP2013/003166
§ 371 (c)(1),
(2) Date: Jan. 10, 2014

(87) PCT Pub. No.: WO2013/183234
PCT Pub. Date: Dec. 12, 2013

(65) Prior Publication Data
US 2014/0151085 A1 Jun. 5, 2014

(30) Foreign Application Priority Data

Jun. 6, 2012 (JP) ................................. 2012-128890

(51) Int. Cl.
*H01L 21/00* (2006.01)
*H01B 5/14* (2006.01)
(Continued)

(52) U.S. Cl.
CPC ............ *H01B 5/14* (2013.01); *G06F 3/041* (2013.01); *H01B 13/003* (2013.01);
(Continued)

(58) Field of Classification Search
CPC ............................................. H01L 31/022466
See application file for complete search history.

(56) References Cited

U.S. PATENT DOCUMENTS 9,059,422 B2 * 6/2015 Meguro .......... H01L 31/022466
2010/0024862 A1 * 2/2010 Tawada ................. C23C 14/086
136/244
2011/0298756 A1 12/2011 Kim et al.

FOREIGN PATENT DOCUMENTS

CN 102270069 12/2011
JP 2009-199986 9/2009
(Continued)

OTHER PUBLICATIONS

Notification of Transmittal of translation of the International Preliminary Report on Patentability (IPROP) issued Dec. 18, 2014 in International (PCT) Application No. PCT/JP2013/003166, together with IPROP and translation of Written Opinion.
(Continued)

*Primary Examiner* — Zandra Smith
*Assistant Examiner* — Andre' C Stevenson
(74) *Attorney, Agent, or Firm* — Wenderoth, Lind & Ponack, L.L.P.

(57) ABSTRACT

There is provided a transparent electrode comprising a supporting substrate, a first transparent electrically-conductive film provided on the supporting substrate, a transparent insulating film provided on the first transparent electrically-conductive film, and a second transparent electrically-conductive film provided on the transparent insulating film. In the transparent electrode of the present invention, all of the first transparent electrically-conductive film, the second transparent electrically-conductive film and the transparent insulating film provided therebetween comprise a metal compound, and the first transparent electrically-conductive film and the second transparent electrically-conductive film have a crystalline structure, whereas the transparent insulating film has an amorphous structure.

25 Claims, 6 Drawing Sheets

(51) Int. Cl.
*G06F 3/041* (2006.01)
*H01B 13/00* (2006.01)
*H01L 31/0224* (2006.01)
*H01L 31/18* (2006.01)

(52) U.S. Cl.
CPC ... *H01B 13/0036* (2013.01); *H01L 31/022466* (2013.01); *H01L 31/022483* (2013.01); *H01L 31/1884* (2013.01); *H01L 31/1888* (2013.01); *G06F 2203/04103* (2013.01); *Y02E 10/50* (2013.01)

(56) References Cited

FOREIGN PATENT DOCUMENTS

| | | |
|---|---|---|
| JP | 2009-224152 | 10/2009 |
| JP | 2010-21048 | 1/2010 |
| JP | 2010-61425 | 3/2010 |
| JP | 2010-126402 | 6/2010 |
| JP | 2010-182472 | 8/2010 |
| JP | 2011-76802 | 4/2011 |
| JP | 2012-53594 | 3/2012 |
| WO | 2010/103815 | 9/2010 |

OTHER PUBLICATIONS

International Search Report (ISR) issued Aug. 20, 2013 in International (PCT) Application No. PCT/JP2013/003166.
Chinese Office Action issued Oct. 12, 2015 in corresponding Chinese Patent Application No. 201380002131.7. (Partial English Translation).

* cited by examiner

F i g. 4

$(C_2H_5)_2 Zn + 2H_2O \rightarrow Zn(OH)_2 + 2C_2H_6$ $Zn(OH)_2 \rightarrow ZnO + H_2O$ Patterning of first transparent electrically-conductive film Patterning of second transparent electrically-conductive film

TRANSPARENT ELECTRODE AND METHOD FOR MANUFACTURING THE SAME

TECHNICAL FIELD

The present invention relates to a transparent electrode, and a method for manufacturing the same. More particularly, the present invention relates to a transparent electrode used for various devices which are required to have an electrode, and also relates to a method for manufacturing such transparent electrode.

BACKGROUND OF THE INVENTION

As a popularization of digital devices and information terminals advances, a touch panel is often used as one of input devices for performing a data entry in mobile terminals (e.g., smartphones), computers, electronic diaries, portable game devices, digital cameras or the like. The touch panel has a high transparency, and is capable of providing an intuitive operation for data entry by sensing the position of a finger or pen when it comes into contact with or comes into vicinity of an input surface of the panel.

It is required for the transparent electrode used for the touch panel to have not only a high light transmittance regarding a visible light region, but also a high electrical conductivity. Such transparent electrode is also used as an electrode of solar batteries, liquid crystal display elements and other various light-receiving elements, as well as antistatic films. The transparent electrode having the low resistance is needed especially in the fields of solar batteries, display elements (e.g., liquid crystal, organic electroluminescence and inorganic electroluminescence) and touch panels used therefor.

As a material for a transparent electrically-conductive thin film of such transparent electrode, ITO (i.e., indium oxide containing a tin as a dopant) is now most commonly used from an industrial perspective. The film made of such ITO has a particularly low resistance and is easy to produce. However, there has been a concern about the depletion of an In element which is used as a main element of the ITO. Therefore, there has been recently carried out a research regarding alternatives to the ITO, i.e., the research regarding film-formable materials having not only a transparency but also an electrical conductivity.

As a metal oxide for the alternative to the ITO, there have been used a tin oxide ($SnO_2$), an ATO where an antimony is contained therein as a dopant, and a FTO where a fluorine is contained therein as a dopant. There have also been used a zinc oxide (ZnO), an AZO where an aluminum is contained therein as a dopant, and a GZO where a gallium is contained therein as a dopant. See Patent Documents 1 and 2, for example.

In order to produce a transparent electrode from such metal oxide, there have often been employed physical film-forming methods such as a deposition method, a sputtering method and an ion-plating method, or chemical film-forming methods such as a chemical vapor deposition (CVD) method. However, these methods are accompanied by problems that not only a production cost is higher due to a significantly low film-forming rate, but also the size of the formed film is restricted by the size of a vacuum vessel of a vacuum apparatus, which fails to manufacture a large-sized transparent electrode.

PRIOR ART DOCUMENTS

Patent Documents

Patent Document 1: JP 2009-199986 A
Patent Document 2: JP 2009-224152 A

DISCLOSURE OF THE INVENTION

Problems to be Solved by the Invention

In view of the problems mentioned above, there has been proposed a manufacturing method in which a coating process is employed for a film production (see, for example, JP 2010-126402 A). Such coating method can provide a better productivity while using a simpler manufacturing facility as compared with a CVD method. The inventors of the present application have studied and developed a transparent electrode used for a touch panel in connection with the above proposed manufacturing method. In particularly, they have intensively studied the configuration/structure of the transparent electrode made of a metal compound-based transparent electrically-conductive thin film.

For example, a capacitive touch panel requires a two-layered transparent electrode which is composed of an upper electrode and a lower electrode. Such touch panel electrode is generally manufactured as follows. First, two pairs of laminated structures, each of which includes a transparent electrically-conductive thin film formed on a substrate, are prepared. Then, a wiring pattern is formed in the upper electrode, and another wiring pattern is formed in the lower electrode. Thereafter, theses laminated structures are mutually positioned and are bonded to each other by an "adhesion layer having electrical insulation properties", which leads to a completion of the manufacturing of the touch panel. With respect to such configuration/structure of the electrode for the touch panel, the inventors of the present application have found that, such configuration/structure causes an increase in the number of layers in the touch panel, and thereby the total thickness of the touch panel becomes lager. This results in a decrease in a light transmittance of the visible light region. They have also found that such configuration/structure is involved with complicated manufacturing processes, and thus it is not necessarily appropriate. For example, an appropriate positioning of the upper and lower electrodes is required when they are bonded to each other, and also air bubbles should be prevented from intruding between the layers of the touch panel. Furthermore, they have found that the boding between the electrode layers via the adhesion layer can adversely induce a layer peeling from another layer.

Under these circumstances, the present invention has been created. That is, the present invention is directed to a provision of a transparent electrode having an innovative configuration/structure by which a "conventional configuration/structure equipped with the adhesion layer that has been conventionally considered as an indispensable element" is replaced, such transparent electrode also contributing to an improvement in its productivity.

Means for Solving the Problems

The present invention provides a transparent electrode comprising:
a supporting substrate;
a first transparent electrically-conductive film provided on the supporting substrate;

a transparent insulating film provided on the first transparent electrically-conductive film; and a second transparent electrically-conductive film provided on the transparent insulating film, wherein all of the first transparent electrically-conductive film, the second transparent electrically-conductive film and the transparent insulating film provided therebetween comprise a metal compound, and wherein the first transparent electrically-conductive film and the second transparent electrically-conductive film have a crystalline structure, whereas the transparent insulating film has an amorphous structure.

The present invention is characterized at least in that all of the first transparent electrically-conductive film and the second transparent electrically-conductive film, and the transparent insulating film provided between the first and second transparent electrically-conductive films include the metal compound, and that a so-called "adhesion layer/adhesive layer" is not used. It is particularly preferred in the transparent electrode of the present invention that a metal element, which constitutes the metal compound, is the same among the first transparent electrically-conductive film, the second transparent electrically-conductive film, and the transparent insulating film. In other words, it is preferred in the transparent electrode of the present invention that the metal compounds in respective ones of these three transparent thin films are compounds based on the same kind of metal as each other.

The present invention also provides a method for manufacturing the above transparent electrode. Such manufacturing method of the present invention comprises sequentially applying a first transparent electrically-conductive film raw material, a transparent insulating film raw material, and a second transparent electrically-conductive film raw material with respect to a supporting substrate heated at a predetermined temperature, and thereby forming a lamination of a first transparent electrically-conductive film, a transparent insulating film, and a second transparent electrically-conductive film on the supporting substrate, the method comprising the steps of:

(i) applying the first transparent electrically-conductive film raw material to the supporting substrate, and thereby forming the first transparent electrically-conductive film on the supporting substrate;

(ii) applying the transparent insulating film raw material to the first transparent electrically-conductive film, and thereby forming the transparent insulating film on the first transparent electrically-conductive film; and (iii) applying the second transparent electrically-conductive film raw material to the transparent insulating film, and thereby forming the second transparent electrically-conductive film on the transparent insulating film, wherein all of the first transparent electrically-conductive film raw material, the transparent insulating film raw material and the second transparent electrically-conductive film raw material comprise an organic metal compound and an organic solvent, and wherein the first transparent electrically-conductive film and the second transparent electrically-conductive film, which are to be formed in the steps (i) and (iii), have a crystalline structure, whereas the transparent insulating film, which is to be formed in the step (ii), has an amorphous structure.

The manufacturing method of the present invention is characterized at least in that all of the raw materials for the first and second transparent electrically-conductive films having the crystalline structures respectively, and the raw material for the transparent insulating film having the amorphous structure comprise the organic metal compound and the organic solvent. It is particularly preferred in the manufacturing method of the present invention that a metal element, which constitutes the organic metal compound, is the same among the first transparent electrically-conductive film raw material, the second transparent electrically-conductive film raw material, and the transparent insulating film raw material. In other words, it is preferred in the manufacturing method of the present invention that the organic metal compounds of respective ones of the raw materials for these three transparent films are compounds based on the same kind of metal as each other.

Effects of the Invention

In the transparent electrode according to an embodiment of the present invention, the adhesion layer, which has been conventionally considered as the indispensable element, is not used, and thereby the number of layers is decreased. As a result, the transparent electrode according to an embodiment of the present invention, which is to be used for a touch panel for example, makes it possible to realize a thin touch panel with a high transparency. Moreover, the transparent electrode according to an embodiment of the present invention makes it possible to prevent the layer peeling from occurring in spite of the fact that no adhesion layer is provided in the transparent electrode. The reason for this is that the metal compounds in respective ones of the first transparent electrically-conductive film, the second transparent electrically-conductive film and the transparent insulating film are based on the same kind of metal as each other, and thereby a satisfactory adhesion between films can be achieved.

In accordance with the manufacturing method according to an embodiment of the present invention, a comparatively simple manufacturing process can be realized. The reason for this is that the raw materials for all the films of the transparent electrode are based on the same kind of metal as each other, and that the sequential provisions of the raw materials are performed by an application process (e.g., spray process).

BRIEF DESCRIPTION OF THE DRAWINGS

FIG. 4 shows a chemical reaction scheme when "diethyl zinc" is used as an organic metal compound for each of raw materials for film formations.

MODES FOR CARRYING OUT THE INVENTION

Figure 1:
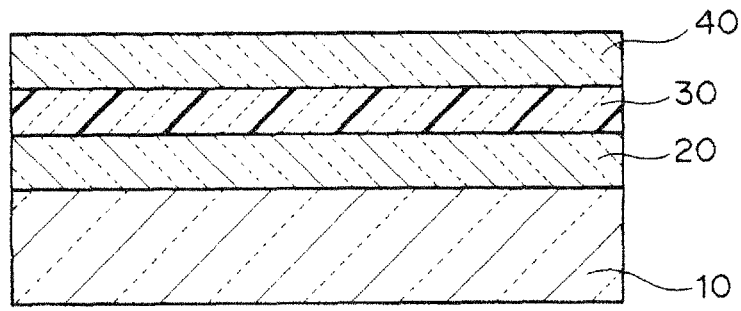
FIG. 1 is a cross-sectional view schematically illustrating the configuration/structure of a transparent electrode according to an embodiment of the present invention.

The embodiments of the present invention will be described in detail below with reference to the accompanying drawings. First, a transparent electrode according to an embodiment of the present invention will be described, and then a manufacturing method of the present invention will be described. Note that various elements schematically shown in the drawings are intended for an easy understanding of the present invention, and thus a dimensional ratio and an appearance can be different from those of the actual ones. The transparent electrode according to an embodiment of the present invention can be particularly suitably used in touch panel applications, but can also be suitably used as an electrode for various devices which are needed to be transparent, as described in the columns [Industrial Applicability].

[Configuration/Structure of Transparent Electrode According to Embodiment of Present Invention]

A configuration/structure of a transparent electrode according to an embodiment of the present invention is schematically illustrated in FIG. 1. As can be seen from FIG. 1, the transparent electrode 100 according to an embodiment of the present invention includes a supporting substrate 10, a first transparent electrically-conductive film 20, a transparent insulating film 30, and a second transparent electrically-conductive film 40. More specifically, the first transparent electrically-conductive film 20 is provided on the substrate 10, the transparent insulating film 30 is provided on the first transparent electrically-conductive film 20, and the second transparent electrically-conductive film 40 is provided on the transparent insulating film 30. Namely, the transparent electrode 100 according to an embodiment of the present invention has such a structure that the transparent insulating film 30 disposed over the substrate 10 is located between the first transparent electrically-conductive film 20 and the second transparent electrically-conductive film 40.

Particularly according to an embodiment of the present invention, the first transparent electrically-conductive film 20 and the second transparent electrically-conductive film 40, and the transparent insulating film 30 provided therebetween comprise a metal compound. Moreover, the first transparent electrically-conductive film 20 and the second transparent electrically-conductive film 40 have a crystalline structure, whereas the transparent insulating film 30 has an amorphous structure.

With respect to the metal compounds of respective materials of the above three transparent films, it is preferred that metal elements constituting the respective ones of the metal compounds are the same as each other. Namely, a metal element, which constitutes the metal compound of each film, is the same among the first transparent electrically-conductive film 20, the second transparent electrically-conductive film 40, and the transparent insulating film 30. Examples of such metal element (i.e., metal) may include a zinc element (Zn), for example.

The first transparent electrically-conductive film 20 and the second transparent electrically-conductive film 40 have the "crystalline structure", in contrast to the structure of the transparent insulating film 30. While on the other hand, the transparent insulating film 30 has the "amorphous structure", in contrast to the structures of the first transparent electrically-conductive film 20 and the second transparent electrically-conductive film 40. The X-ray diffraction (XRD) analysis enables an identification of the "crystallinity" of the first and second transparent electrically-conductive films (20, 40), and the "amorphousness" of the transparent insulating film 30. In this respect, the film can be regarded as having "crystalline structure" when the film exhibits a clear diffraction peak in X-ray diffraction analysis, whereas the film can be regarded as having "amorphous structure" when the film exhibits no substantial diffraction peak in X-ray diffraction analysis.

In the transparent electrode according to an embodiment of the present invention, the supporting substrate 10 at least serves to support the transparent thin film(s) to be disposed thereon. For example, in a case where the transparent electrode is used for a touch panel, the supporting substrate 10 is preferably made of a material having a high light transmittance (i.e., a material having a suitable transmittance allowing it to be transparent even in the touch panel). Examples of such supporting substrate 10 include a substrate made of glass, a substrate made of plastic resin. The supporting substrate 10 may also be a resin film. Examples of the resin film to be used as the supporting substrate may include a polyester film (e.g., PEN film, PET film, etc.), an aramid film, and a polyimide film. The supporting substrate 10 may have the thickness of 100 µm or less, i.e., 0 (excluding 0 µm) to 100 µm, when an improved light transmittance is the most desired in the transparent electrode.

The first transparent electrically-conductive film 20, the second transparent electrically-conductive film 40, and the transparent insulating film 30 are "transparent" as can been seen from their expressions. As used here, the term "transparent" (i.e., "transparent" of the first transparent electrically-conductive film, the second transparent electrically-conductive film, and the transparent insulating film) substantially means that each film has an average light transmittance of 80% or higher in a case of a visible light (wavelength of visible light: about 400 nm to about 700 nm). Namely, the first transparent electrically-conductive film 20, the second transparent electrically-conductive film 40, and the transparent insulating film 30 respectively exhibit the light transmittance of 80% or more in the case where the light wavelength of 400 nm to 700 nm is used.

The first transparent electrically-conductive film 20 and the second transparent electrically-conductive film 40 are "electrically conductive" as can been seen from their expressions. As used herein, the term "electrically conductive" (i.e., "electrically conductive" of the first transparent electrically-conductive film and the second transparent electrically-conductive film) substantially means that each film exhibits a sheet resistance of $1 \times 10^3 \Omega/\square$ or lower. While on the other hand, the transparent insulating film 30 has "electrical insulating properties" (i.e., electrically higher-resistant properties) as can been seen from its expression. As used here, the term "insulating" (i.e. "insulation properties" of the transparent insulating film) substantially means that the film exhibits a sheet resistance of $1 \times 10^6 \Omega/\square$ or higher.

The first transparent electrically-conductive film 20 and the second transparent electrically-conductive film 40 are in a form of a so-called "thin film". It is preferred in this regard that the first transparent electrically-conductive film 20 and the second transparent electrically-conductive film 40 respectively have the thickness of 2 µm or less, i.e., thickness of 0 (excluding 0) to 2 µm. For example, each thickness of the first transparent electrically-conductive film 20 and the second transparent electrically-conductive film 40 is in the range of 0.5 µm to 2 µm. The reason for such thickness is that the film thickness of more than 2 µm may cause a cracking phenomenon due to a stress in the film, which will lead to a deterioration of electrical characteristics, or may cause a decrease in light transmittance due to a white turbidity phenomenon.

As mentioned above, both of the first transparent electrically-conductive film 20 and the second transparent electrically-conductive film 40 have the crystalline structure. The first transparent electrically-conductive film 20 and the second transparent electrically-conductive film 40 are made of a metal compound. The metal compound of the first transparent electrically-conductive film 20 and the second transparent electrically-conductive film 40 may be a zinc compound, for example. In the light of a preferred embodiment wherein the metal compounds of the respective ones of the three transparent thin films are based on the same metal as each other, the transparent insulating film 30 is made of a metal compound which may also be a zinc compound. Namely, according to a preferred embodiment, the metal compounds contained in respective ones of the first transparent electrically-conductive film 20, the second transparent electrically-conductive film 40, and the transparent insulating film 30 are zinc compounds (i.e. Zn compounds), respectively.

More specifically, each of the first transparent electrically-conductive film 20 and the second transparent electrically-conductive film 40 at least contains a zinc oxide, whereas the transparent insulating film 30 at least contains a zinc hydroxide. Namely, a main material of each of the first transparent electrically-conductive film 20 and the second transparent electrically-conductive film 40 is the zinc oxide (ZnO), whereas a main material of the transparent insulating film 30 is the zinc hydroxide ($Zn(OH)_2$). It should be noted that, due to a film-forming process, the first transparent electrically-conductive film 20 and the second transparent electrically-conductive film 40 might inevitably contain a trace of the zinc hydroxide in addition to "zinc oxide", whereas the transparent insulating film 30 might also inevitably contain a trace of zinc oxide in addition to "zinc hydroxide". In a case where the first transparent electrically-conductive film 20 and the second transparent electrically-conductive film 40 include the zinc oxide and the transparent insulating film 30 includes the zinc hydroxide, the first transparent electrically-conductive film 20 and the second transparent electrically-conductive film 40 are in an electrically-insulated state from each other via the amorphous transparent insulating film 30. This means that a laminated structure including two-layered transparent electrically-conductive layers is provided on the supporting substrate 10.

With respect to the "crystallinity" of the first transparent electrically-conductive film 20 and the second transparent electrically-conductive film 40, they preferably have the crystalline structure which is in a form of needle. In other words, it is preferred that each of the first transparent electrically-conductive film 20 and the second transparent electrically-conductive film 40 is made of fine crystalline material having an angular tip. The crystalline structure in a form of needle is preferably oriented in the direction that is approximately perpendicular to the supporting substrate. Namely, it is preferred that an angular tip of the fine crystalline material is oriented in the direction that is approximately perpendicular to a main plane of the supporting substrate. In a case where the first transparent electrically-conductive film 20 and the second transparent electrically-conductive film 40 include the zinc oxide (ZnO), a crystal of the zinc oxide preferably has a needle-like crystalline structure, and such needle-like crystalline structure of the zinc oxide is preferably oriented in the direction that is approximately perpendicular to the supporting substrate. This means that the crystalline structure of the zinc oxide is in an approximately unidirectional form, as a whole.

While on the other hand, the amorphous transparent insulating film 30 has no crystal structure, and thus the material of the film 30 does not have the "approximately unidirectional form". This means that the film 30 has "amorphous form" in the transparent electrode according to an embodiment of the present invention. In this regard, for example in a case where the transparent insulating film 30 is made at least of the zinc hydroxide, the film 30 preferably includes spherical particles thereof. The transparent insulating film 30 may have the thickness of 1 μm or more. The upper limit of the thickness of the transparent insulating film 30 may be, but not limited to, about 5 μm for example.

In the transparent electrode according to an embodiment of the present invention, at least one of the first transparent electrically-conductive film 20, the second transparent electrically-conductive film 40, and the transparent insulating film 30 may contain a Group IIIB element (i.e., Group 3B element). The containing of the Group IIIB element in the film makes it possible to more intentionally control physical properties of the film such as "transparency" and "electrical conductivity". Preferably, both of the first transparent electrically-conductive film 20 and the second transparent electrically-conductive film 40 contain the Group IIIB element. Take an example of a case where the first transparent electrically-conductive film 20 and the second transparent electrically-conductive film 40 are made of the zinc oxide having crystalline structure, the Group IIIB element may be contained in each film as a dopant for the crystalline-structure zinc oxide. This means that the films preferably contain, as a dopant element, at least one kind of an element selected from the group consisting of B (boron), Al (aluminum), Ga (gallium) and In (indium). From the viewpoint of future depletion of indium, the films preferably contain, as a dopant element, the Group IIIB element(s) except for "In" element, i.e., at least one kind of the Group IIIB element selected from the group consisting of B (boron), Al (aluminum), and Ga (gallium). In particular, Ga (gallium) element can contribute to a flattening of the film. For this reason, the Ga (gallium) element is particularly preferred if such viewpoint is more valued. The kind of the Group IIIB element contained in the first transparent electrically-conductive film 20 may be different from that of the Group IIIB element contained in the second transparent electrically-conductive film 40. This makes it possible to appropriately differentiate various physical properties (e.g., electrically conductivity) between the first transparent electrically-conductive film 20 and the second transparent electrically-conductive film 40, which will lead to an increase in the degree of the design freedom for the transparent electrode. Similarly, the kind of the Group IIIB element contained in each of the first transparent electrically-conductive film 20 and the second transparent electrically-conductive film 40 may be different from that of the Group IIIB element contained in the transparent insulating film 30.

In the transparent electrode according to an embodiment of the present invention, the first transparent electrically-conductive film 20 and the second transparent electrically-conductive film 40 may have a patterned form. The "patterned form" can contribute to a realization of the suitable transparent electrode that is more appropriate for touch panel applications. In a case where the patterned form of the first transparent electrically-conductive film 20 and the second transparent electrically-conductive film 40 is made of zinc oxide, the increased degree of freedom for the production process can be achieved since the zinc oxide can be easily subjected to an etching treatment by acid or alkaline.

The transparent electrode according to an embodiment of the present invention may include a gas barrier film which is provided on a surface of the supporting substrate 10. Namely, there may be provided a layer having a form of a thin film between the supporting substrate 10 and the first transparent electrically-conductive film 20. Such gas barrier film makes it possible to prevent an impurity ion, a gas and/or a moisture from migrating or diffusing into the first transparent electrically-conductive film 20 from the substrate 10. By way of example, the gas barrier film, which is located on the surface of the supporting substrate, may be made at least of silicon oxide and/or silicon nitride.

The transparent electrode as described above according to an embodiment of the present invention has a decreased number of layers. Therefore, when the transparent electrode according to an embodiment of the present invention is used for touch panel for example, there can be realized a thin touch panel with high transparency. Specifically, the transparent electrode does not have a so-called "adhesion layer", and thereby the number of layers is typically decreased in the transparent electrode, which leads to an improved light transmittance of the electrode. In spite of no adhesion layer, a satisfactory adhesion between the first transparent electrically-conductive film, the second transparent electrically-conductive film and the transparent insulating film is provided in the transparent electrode according to an embodiment of the present invention. The reason for this is that the metal compounds in respective ones of the first transparent electrically-conductive film, the second transparent electrically-conductive film and the transparent insulating film are based on the same kind of metal as each other. Such satisfactory adhesion between layers makes it possible to prevent the layer peeling from occurring. It should be noted that an embodiment of the present invention provides a suitable structure of the lamination in the electrode. Specifically, in spite of the fact that all of the thin films of the electrode are based on the same kind of metal as each other, an embodiment of the present invention can achieve different physical properties in the lamination (especially, the suitable difference between "electrical conductivity" and "insulation" in the lamination), at least due to the difference between "crystallinity" and "amorphousness" of the films.

More specifically, the transparent electrode according to an embodiment of the present invention does not make use of ITO (i.e., indium oxide containing "Sn" as a dopant) which is regarded as containing a rare metal, and instead makes use of a zinc oxide-based material that is rich in natural resources and is smaller in cost. In spite of the use of such zinc oxide-based material, a desirable structure of the lamination, which is especially suitable for the transparent electrode, can be achieved. Particularly in a case where the transparent electrode according to an embodiment of the present invention is used as a transparent electrode of touch panel, a multi-laminated structure that is appropriate for the touch panel can be provided while preventing the light transmittance from being lowered. It should be noted in this regard that, in spite of no provision of the adhesive layer as the interlayer, a comparatively high adhesion between layers can be achieved in the electrode since "same substance-based material consisting of the zinc compound as a main component" is used among the electrically-conductive and insulating thin film layers.

[Manufacturing Method of the Present Invention]

Next, a manufacturing method of the present invention will be described below. The manufacturing method according to an embodiment of the present invention is directed to a method for manufacturing the above transparent electrode. Such manufacturing method comprises sequentially applying a first transparent electrically-conductive film raw material, a transparent insulating film raw material, and a second transparent electrically-conductive film raw material to a supporting substrate heated at a predetermined temperature in order to form a lamination of a first transparent electrically-conductive film, a transparent insulating film, and a second transparent electrically-conductive film on the supporting substrate. Namely, the present invention according to an embodiment of the present invention performs a film formation by disposing some layers (particularly, nano-order layers) sequentially onto the substrate which has been beforehand heated at a preset temperature.

The term "predetermined temperature" used in connection with the manufacturing method of the present invention substantially means a temperature to be required for a film formation. Considering that the manufacturing method of the present invention is involved with the formations of the first transparent electrically-conductive film, the second transparent electrically-conductive film and the transparent insulating film from respective ones of the applied raw materials by a heat from the heated substrate, a temperature required for such film formations can correspond to "predetermined temperature".

Figure 2A:
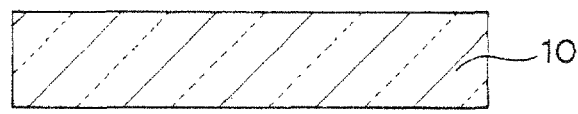
FIGS. 2A to 2D are cross-sectional views schematically illustrating process embodiments according to an embodiment of a manufacturing method of the present invention.
Figure 2B:
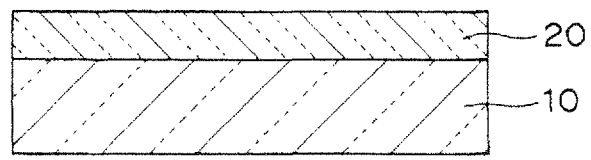

The manufacturing method according to an embodiment of the present invention is carried out firstly by the step (i). That is, a first transparent electrically-conductive film raw material is applied onto a supporting substrate 10 to form a first transparent electrically-conductive film 20 on the supporting substrate 10, as illustrated in FIGS. 2A and 2B.

The supporting substrate may be a glass substrate or a plastic resin substrate. The supporting substrate may also be a resin film. When a dimensional stability regarding the heat-resisting properties is more valued, the glass substrate may be suitably used as the supporting substrate. With respect to the provision of the supporting substrate, a commercially available substrate may be used as it is. Alternatively, the supporting substrate may also be newly produced by a conventional manufacturing method of substrates in general. In the case where the transparent electrode with "gas barrier film" included therein is manufactured, it is preferable to prepare the supporting substrate on which surface the gas barrier film has been already provided. For example, it is possible to provide the gas barrier film on the surface of the supporting substrate by disposing a layer of a silicon oxide or a silicon nitride through performing a sputtering process, especially a magnetron sputtering process.

The first transparent electrically-conductive film raw material comprises an organic metal compound and an organic solvent. It is preferred that a metal element which constitutes the organic metal compound of the first transparent electrically-conductive film raw material is the same as those of organic metal compounds of the other film raw materials (i.e., "transparent insulating film raw material" and "second transparent electrically-conductive film raw material"). The material (especially, metal compound) of the resulting film depends on the kind of the organic metal compound of the film raw material. By way of example, the organic metal compound contained in the first transparent electrically-conductive film raw material may be an organic zinc compound (preferably, diethyl zinc). While on the other hand, the organic solvent contained in the first transparent electrically-conductive film raw material may be any suitable kind of solvents as long as it serves as a medium for the organic metal compound. For example, the organic solvent may be a hexane, a heptane, a toluene or the like. Alcohol-based solvents such as a dehydrated isopropyl alcohol; amine-based solvents such as a trimethylamine and a triethylamine serving as solvents having electron-donating properties; and ether-based solvents such as a diethyl ether and a diisopropyl ether may also be used as the organic solvent. These solvents may also be used in combination of each other as the organic solvent of the first transparent electrically-conductive film raw material. In the case where "doping" is valued, a doping material may be added to the first transparent electrically-conductive film raw material. Examples of such doping material include Group IIIB metal compounds (i.e., Group IIIB metal salts).

For example, the doping material may be a Group IIIB metal-containing chloride compound, a Group IIIB metal-containing nitrate compound, a Group IIIB metal-containing acetate compound or a Group IIIB metal-containing organic metal compound.

Figure 3:
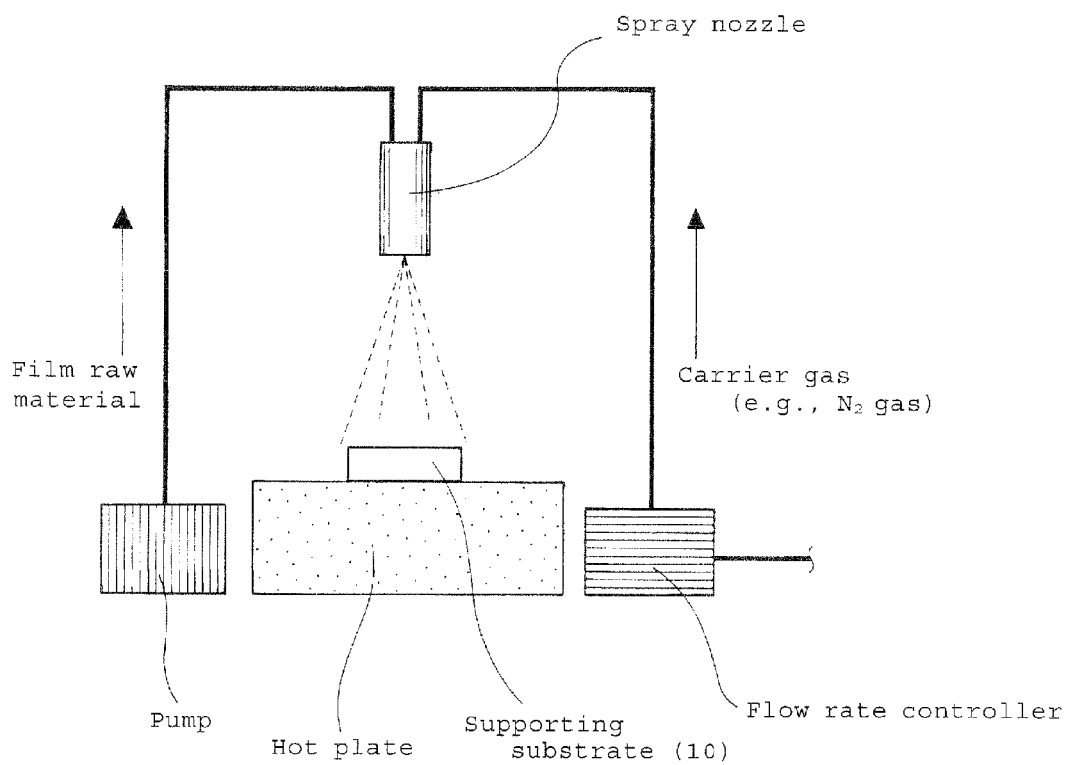
FIG. 3 is a schematic view illustrating a spray atomization according to an embodiment of the present invention.
Figure 3:
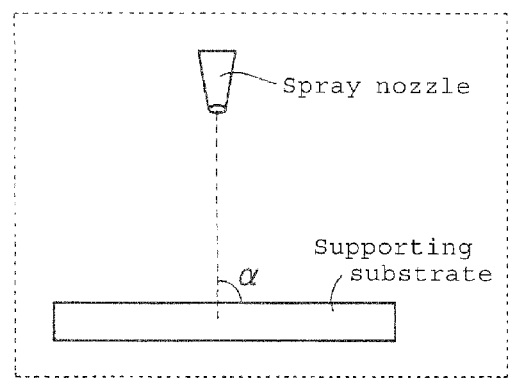
Figure 5A:
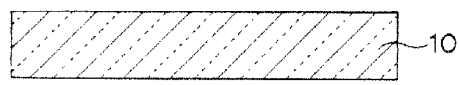
FIGS. 5A to 5F are cross-sectional views schematically illustrating process embodiments (particularly, embodiments of "patterning process") according to an embodiment of a manufacturing method of the present invention.
Figure 5B:
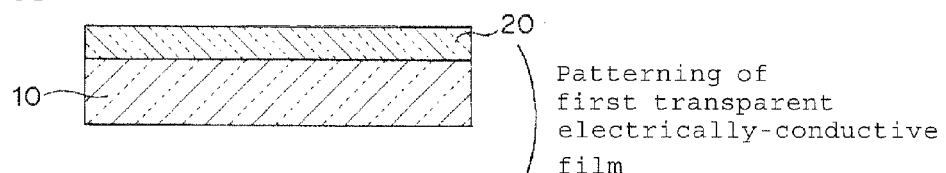
Figure 5C:
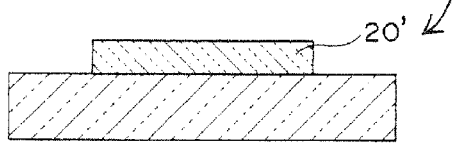
Figure 5D:
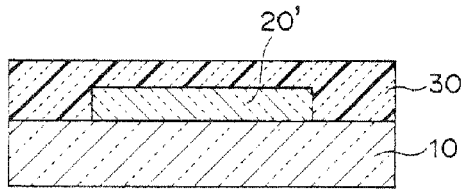
Figure 5E:
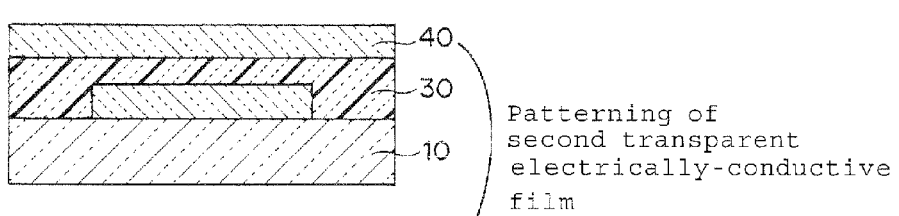
Figure 5F:
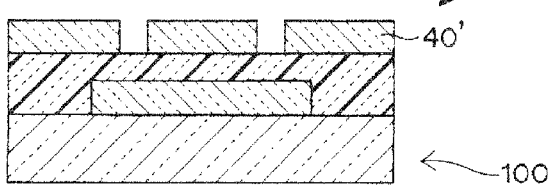

The first transparent electrically-conductive film raw material has fluidity. Because of the fluidity, the first transparent electrically-conductive film raw material can be applied to the supporting substrate by a suitable coating method. In this regard, a spraying method may be preferably employed as the coating method. Specifically, the spraying method may be performed to apply the first transparent electrically-conductive film raw onto the supporting substrate, and thereby the first transparent electrically-conductive film is formed (see FIG. 3). With respect to the spraying method, as illustrated in FIG. 3, the first transparent electrically-conductive film raw material may be mixed with a carrier gas under atmospheric pressure, and thereafter a spray atomization of the resulting mixture may be performed over a supporting substrate by using a spray nozzle. It is preferred that the size of each droplet of the raw material from the spray nozzle in the spraying method is determined by taking various conditions such as an ease of vaporization of the solvent of the raw material until reaching the supporting substrate, an adhesion on the supporting substrate, and an in-plane uniform coated film properties. For example, the droplets of the raw material from the spray nozzle have a uniform size preferably in the range of 1 µm to 50 µm, more preferably in the range of 1 µm to 30 µm).

The first transparent electrically-conductive film raw material is subjected to a heat treatment by being applied onto the heated supporting substrate 10. Such heat treatment of the first transparent electrically-conductive film raw material leads to a formation of the first transparent electrically-conductive film therefrom. In other words, the formation of the first transparent electrically-conductive film from the first transparent electrically-conductive film raw material proceeds due to the heat from the supporting substrate which has been beforehand heated at the preset temperature. It is preferable to make the heating temperature of the supporting substrate different from that of the supporting substrate in the subsequent step (ii). Namely, it is preferred that the heating temperature of the supporting substrate differs between "step (i) for the formation of the first transparent electrically-conductive film" and "step (ii) for the formation of the transparent insulating film".

It is preferred in the manufacturing method according to an embodiment of the present invention that "crystallinity" and "amorphousness" of the films are obtained by making the "heating temperature of the supporting substrate in the step (i) for the formation of the first transparent electrically-conductive film" higher than the "heating temperature of the supporting substrate in the step (ii) for the formation of the transparent insulating film". This means that the "heating temperature of the supporting substrate in the step (ii) for the formation of the transparent insulating film" is made lower than the "heating temperature of the supporting substrate in the step (i) for the formation of the first transparent electrically-conductive film", and thereby the "crystallinity" and "amorphousness" of the films are controlled. Specifically, the first transparent electrically-conductive film can be formed so as to have the "crystalline structure" whereas the transparent insulating film can be formed so as to have the "amorphous structure" by making the "preset temperature of the supporting substrate in the step (i)" higher than the "preset temperature of the supporting substrate in the step (ii)", that is, conversely by making the "preset temperature of the supporting substrate in the step (ii)" lower than the "preset temperature of the supporting substrate in the step (i)".

More specifically, when the organic metal compound contained in the first transparent electrically-conductive film raw material and the transparent insulating film raw material (which will be mentioned below) is the organic zinc compound (e.g., diethyl zinc), the first transparent electrically-conductive film (namely, "first transparent electrically-conductive film made of zinc compound") can be formed so as to have the "crystalline structure" whereas the transparent insulating film (namely, "transparent insulating film made of zinc compound") can be formed so as to have the "amorphous structure" by heating the "supporting substrate in the step (i)" at a temperature of 100° C. or higher, and while on the other hand heating the "supporting substrate in the step (ii)" at a temperature of lower than 100° C. The lower limit regarding the heating temperature of the "supporting substrate in the step (ii)", which is not particularly limited to, may be "around room temperature (i.e., approximately in the range of 20° C. to 25° C.)" for example.

Figure 2C:
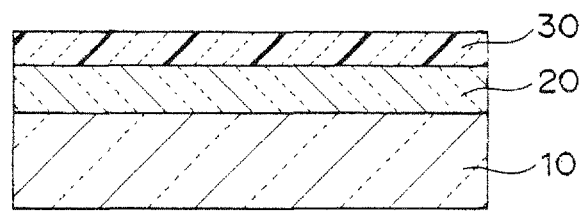

Subsequent to the step (i), the step (ii) is carried out. Namely, as illustrated in FIGS. 2B and 2C, the transparent insulating film raw material is applied onto the first transparent electrically-conductive film 20 to form the transparent insulating film 30 on the first transparent electrically-conductive film 20.

The transparent insulating film raw material comprises an organic metal compound and an organic solvent. It is preferred that a metal element which constitutes the organic metal compound of the transparent insulating film raw material is the same as those of organic metal compounds of the other film raw materials (i.e., "first transparent electrically-conductive film raw material" and "second transparent electrically-conductive film raw material"). The material (especially, metal compound) of the resulting film depends on the kind of the organic metal compound of the film raw material. By way of example, the organic metal compound contained in transparent insulating film raw material may be an organic zinc compound (preferably, diethyl zinc). While on the other hand, the organic solvent contained in the transparent insulating film raw material may be any suitable kind of solvents as long as it serves as a medium for the organic metal compound. For example, the organic solvent may be a hexane, a heptane, a toluene or the like. Alcohol-based solvents such as a dehydrated isopropyl alcohol; amine-based solvents such as a trimethylamine and a triethylamine serving as solvents having electron-donating properties; and ether-based solvents such as a diethyl ether and a diisopropyl ether may also be used as the organic solvent. These solvents may also be used in combination of each other as the organic solvent of the transparent insulating film raw material. In the case where "doping" is valued, a doping material may be added to the transparent insulating film raw material. Similarly to that of the first transparent electrically-conductive film raw material, examples of such doping material include Group IIIB metal compounds (i.e., Group IIIB metal salts) such as a Group IIIB metal-containing chloride compound, a Group IIIB metal-containing nitrate compound, a Group IIIB metal-containing acetate compound and a Group IIIB metal-containing organic metal compound.

Similarly to that of the first transparent electrically-conductive film raw material, the transparent insulating film raw material also has fluidity. Because of the fluidity, the transparent insulating film raw material may also be applied onto the first transparent electrically-conductive film 20 by a suitable coating method to form the transparent insulating film therefrom (see FIG. 3).

The transparent insulating film raw material is subjected to a heat treatment by being applied onto the first transparent electrically-conductive film 20. Similarly to that of the first transparent electrically-conductive film raw material, the formation of the transparent insulating film from the transparent insulating film raw material proceeds due to the heat from the supporting substrate which has been beforehand heated at the preset temperature. As mentioned above, the transparent insulating film can be formed so as to have the "amorphous structure" by differentiating the "heating temperature of the supporting substrate in the step (ii) for the formation of the transparent insulating film" from the "heating temperature of the supporting substrate in the step (i) for the formation of the first transparent electrically-conductive film". Specifically, the transparent insulating film can be formed so as to have the "amorphous structure" by making the "heating temperature of the supporting substrate in the step (ii) for the formation of the transparent insulating film" lower than the "heating temperature of the supporting substrate of the step (i) for the formation of the first transparent electrically-conductive film". More specifically, in a case where the organic metal compound contained in the transparent insulating film raw material and the first transparent electrically-conductive film raw material is the organic zinc compound (e.g. diethyl zinc), the "transparent insulating film made of zinc compound" can be formed to have the "amorphous structure" by heating the "supporting substrate in the step (ii)" at a temperature of lower than 100° C. It should be noted that the first transparent electrically-conductive film made of zinc compound, which has crystalline structure, can be formed by heating the "supporting substrate in the step (i)" at a temperature of 100° C. or higher.

Figure 2D:
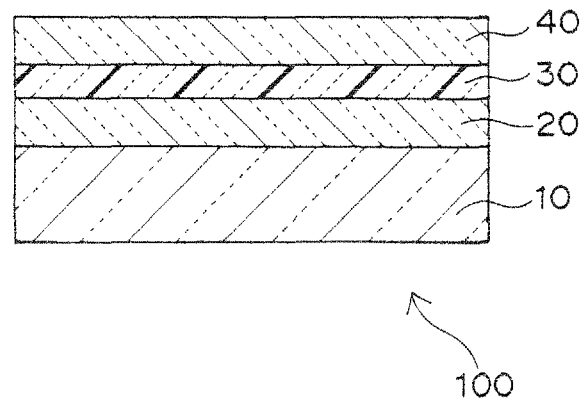

Subsequent to the step (ii), the step (iii) is carried out. Namely, as illustrated in FIGS. 2C and 2D, a second transparent electrically-conductive film raw material is applied onto the transparent insulating film 30 to form the second transparent electrically-conductive film 40 on the transparent insulating film 30.

The second transparent electrically-conductive film raw material may be the same as the first transparent electrically-conductive film raw material. With respect to the organic metal compound of the second transparent electrically-conductive film raw material, a metal element which constitutes the organic metal compound of the second transparent electrically-conductive film raw material is the same as those of organic metal compounds of the other film raw materials (i.e., "transparent insulating film raw material" and "first transparent electrically-conductive film raw material"). The material (particularly, metal compound) of the resulting film depends on the kind of the organic metal compound of the film raw material. By way of example, the organic metal compound contained in the second transparent electrically-conductive film raw material may be an organic zinc compound (preferably, diethyl zinc). The organic solvent contained in the second transparent electrically-conductive film raw material may be the same as that of the first transparent electrically-conductive film raw material. In a case where doping treatments are performed respectively in the first and second transparent electrically-conductive films by using different kinds of elements from each other, the doping materials to be added to the raw materials for respective ones of the first and second transparent electrically-conductive films may be mutually changed.

Similarly to those of the first transparent electrically-conductive film raw material and the transparent insulating film raw material, the second transparent electrically-conductive film raw material also has fluidity. Because of the fluidity, the second transparent electrically-conductive film raw material may also be applied onto the transparent insulating film 30 by a suitable coating method. In particular, the spraying method is preferably performed as the coating method for the purpose of applying the second transparent electrically-conductive film raw material (see FIG. 3).

The second transparent electrically-conductive film raw material is subjected to a heat treatment by being applied onto transparent insulating film 30. Similarly to those of the first transparent electrically-conductive film raw material and the transparent insulating film raw material, the formation of the second transparent electrically-conductive film from the second transparent electrically-conductive film raw material proceeds due to the heat from the supporting substrate which has been beforehand heated at the preset temperature. As implied above, the second transparent electrically-conductive film can be formed to have the "crystalline structure" by differentiating the "heating temperature of the supporting substrate in the step (iii) for the formation of the second transparent electrically-conductive film" from the "heating temperature of the supporting substrate in the step (ii) for the formation of the transparent insulating film". Specifically, the second transparent electrically-conductive film can be formed to have the "crystalline structure" by making the "heating temperature of the supporting substrate in the step (iii) for the formation of the second transparent electrically-conductive film" higher than the "heating temperature of the supporting substrate in the step (ii) for the formation of the transparent insulating film". More specifically, in a case where the organic metal compound contained in the second transparent electrically-conductive film raw material and the transparent insulating film raw material is the organic zinc compound (e.g. diethyl zinc), the "transparent insulating film made of zinc compound" can be formed so as to have the "crystalline structure" by heating the "supporting substrate in the step (iii)" at a temperature of 100° C. or higher. It should be noted that the transparent insulating film having the amorphous structure made of zinc compound" can be formed by heating the "supporting substrate in the step (ii)" at a temperature of lower than 100° C.

Through the steps (i) to (iii) mentioned above, there can be finally obtained the transparent electrode in which all of the first transparent electrically-conductive film 20, the second transparent electrically-conductive film 40 and the transparent insulating film 30 provided therebetween comprise the same metal compound with each other, and the first transparent electrically-conductive film 20 and the second transparent electrically-conductive film 40 have the crystalline structure, whereas the transparent insulating film 30 has the amorphous structure.

In accordance with the manufacturing method as described above, the transparent electrode can be obtained through a lamination process of transparent thin films by performing a coating method. Thus, the manufacturing method according to an embodiment of the present invention makes it possible to exclude the undesirable processes of the conventional art, i.e., the process of forming the adhesion layer for bonding and the process of positioning the upper and lower electrodes. Furthermore, the manufacturing method according to an embodiment of the present invention does not require a large vacuum apparatus since the spraying method is performed to form the transparent thin films of the electrode. Such spraying method enables a large rate formation of the film under the atmospheric air, which leads to a realization of a useful manufacturing process in terms of industrial production. The manufacturing method according to an embodiment of the present invention also makes it possible to achieve a stronger adhesion between films as compared with the conventional case using a so-called "adhesion layer" since the organic metal compounds of respective ones of the film raw materials are the same with each other.

Now, characteristic features with respect to the manufacturing method according to an embodiment of the present invention will be individually described.

In accordance with the manufacturing method according to an embodiment of the present invention, the "transparent electrically-conductive thin film" and the "transparent insulating thin film" are produced from substantially the same raw material by differentiating their heating temperatures with each other. It should be noted in this regard that their heating temperatures are low temperatures as a whole. Specifically, the heating temperature for each of the steps (i) to (iii) may be 300° C. or lower, and preferably 200° C. or lower. Therefore, a resin film can be suitably used as the supporting substrate, which will lead to a higher degree of the design freedom. Take an example where the heating temperature of the supporting substrate in each of the steps (i) and (iii) is adjusted to a temperature of 100° C. or higher, whereas the heating temperature of the supporting substrate in the step (ii) is adjusted to a temperature of lower than 100° C., the heating temperature of the supporting substrate in each of the steps (i) and (iii) can be in the range of 100° C. to 300° C. (preferably 200° C. or lower).

As the organic metal compound of the film raw material, "diethyl zinc" may be suitably used. It is preferred in this case that a solution with the dissolved diethyl zinc in organic solvent may be mixed with a carrier gas under atmospheric pressure, and thereafter a spray atomization of the resulting mixture may be performed over the supporting substrate (see FIG. 3). When such an atomospheric condition that water or steam is present at a room temperature is used as a spraying atmosphere, the reaction of diethyl zinc favorably proceeds to form the thin film consisting of the zinc oxide as a main component (see the chemical reaction formula in FIG. 4). Particularly, in a case of the formations of the first transparent electrically-conductive film and the second transparent electrically-conductive film, the supporting substrate is left to stand under the heated condition of 100° C. to 300° C. (i.e., 100° C. or higher and 300° C. or lower), and thereafter a spraying process is carried out over the surface of the substrate surface. As a result, there can be formed the thin films made of zinc oxide on the supporting substrate, respectively. The heating temperature may be changed depending on the heat-resistant temperature of the substrate. It is generally desired that the supporting substrate is heated at 100° C. or higher so as to obtain a uniform crystal structure in the film. Similarly to the case of the transparent electrically-conductive film, the transparent insulating film can be formed by mixing a solution with the dissolved diethyl zinc in organic solvent with a carrier gas under atmospheric pressure, followed by the spray atomization of the resulting mixture over the supporting substrate (see FIG. 3). When such an atomospheric condition that water or steam is present at a room temperature is used as a spraying atmosphere, the reaction of diethyl zinc favorably proceeds to form the thin film consisting of the zinc hydroxide as a main component (see the chemical reaction formula in FIG. 4). With respect to the formation of the transparent insulating film, it is preferred that the supporting substrate is left to stand under the heated condition of "room temperature or higher" and "lower than 100° C.". The reason for this is that, when the heating temperature of the supporting substrate is in such temperature range, a depositing of diethyl zinc in an amorphous state can be performed without accompanying phenomenon of crystal growth, and thereby the insulating transparent thin film is suitably produced.

In the manufacturing method according to an embodiment of the present invention, a spray nozzle used for the spray atomization may be used in a state of being inclined with respect to the supporting substrate. Namely, an angle between "direction of discharging through the spray nozzle" and "surface of the supporting substrate" (i.e., inclination angle "a" as illustrated in a dotted line frame of FIG. 3) may not necessarily be perpendicular (i.e., 90°) but may be in a range of 30° to 85° for example. The "inclined state" can be obtained at least one of by inclining the spray nozzle with respect to the supporting substrate that has been secured, and conversely by inclining the supporting substrate with respect to the spray nozzle that has been secured. Such inclination of the spray nozzle against the supporting substrate allows the direction of the crystal growth of the film to be controlled, which leads to an improved orientation of the crystal of the film. In other words, by adjusting the inclination angle "a", the direction of the crystal growth of the film can be controlled so that the improved orientation of the crystal is provided in the film. For example, when the inclination angle "a" is adjusted to approximately 90° in the formations of the first transparent electrically-conductive film and the second transparent electrically-conductive film, the crystalline structure in a form of needle can be produced with its orientation being perpendicular to the supporting substrate. Accordingly, when the inclination angle "a" is adjusted to another angle other than 90°, then the crystal orientation of the film can be changed according to such angle.

In the manufacturing method according to an embodiment of the present invention, the first transparent electrically-conductive film may be subjected to a patterning treatment. For example, as illustrated in FIG. 5, the patterning of the first transparent electrically-conductive film 20 may be performed by an etching treatment with an etching solution at any point in time after the formation of the first transparent electrically-conductive film 20 on the supporting substrate 10. As the etching solution, an acidic solution such as a nitric acid solution, phosphoric acid solution and sulfuric acid solution may be used. An alkaline solution (e.g., a sodium hydroxide solution) may also be used as the etching solution. Especially in the case of the spraying method, the patterning treatment can be performed by positioning a patterned mask on the supporting substrate 10, followed by a spraying of the film raw material over the mask and a subsequent removal of the mask. Such use of the mask in the spraying method can eliminate a wet etching step for pattering the film. In this regard, it is also possible to use a resist material in place of the patterned mask in order to produce the patterned film. In a similar manner, the second transparent electrically-conductive film may also be subjected to a patterning treatment. Specifically, as illustrated in FIG. 5, the patterning of the second transparent electrically-conductive film 40 can be performed by an etching treatment with an etching solution at a point in time after the formation of the second transparent electrically-conductive film 40 on the transparent insulating film 30. The etching solution for patterning the second transparent electrically-conductive film may be one similar to those for patterning the first transparent electrically-conductive film. It is particularly preferred to perform the etching treatment of the second transparent electrically-conductive film while taking an etching rate into consideration so as not to cause damage to the transparent insulating film 30. Similarly to the case of the first transparent electrically-conductive film, the patterning treatment of the second transparent electrically-conductive film can also be performed by positioning a patterned mask on the transparent insulating film 30, followed by the spraying of the film raw material and the subsequent removal of the mask. Such use of the mask in the spraying method for the purpose of obtaining the patterned second transparent electrically-conductive film 40' can eliminate a wet etching step for pattering the laminated structure, which leads to an effective prevention of the deterioration of electrical characteristics, such deterioration being attributed to moisture absorption from the wet etching.

The manufacturing method according an embodiment of the present invention may further comprise the step of irradiating the first transparent electrically-conductive film with ultraviolet ray, and/or the step of irradiating the second transparent electrically-conductive film with ultraviolet ray. Namely, the first transparent electrically-conductive film 20 and the second transparent electrically-conductive film 40 may be irradiated with ultraviolet rays. The reason for this is that the irradiation with light in an ultraviolet region enables a decrease in resistance properties of the first transparent electrically-conductive film and the second transparent electrically-conductive film. With respect to the ultraviolet light irradiation, the light with wavelength of 185 nm to 380 nm may be used. Such ultraviolet light irradiation makes it possible to suitably decrease the residue of impurities in the transparent electrically-conductive film. It should be noted that such impurities may inhibit an electrical conductivity of the film. Therefore, the ultraviolet light irradiation can achieve a lower sheet resistance of the transparent electrically-conductive film.

Although a few embodiments of the present invention have been hereinbefore described, they are merely typical examples, and thus the present invention is not limited to these embodiments. It will be readily appreciated by those skilled in the art that various modifications are possible without departing from the scope of the present invention. For example, the following modification can be embodied.

According to the modified embodiment of the present invention, it is possible to provide additional films on the second transparent electrically-conductive film. Specifically, another transparent insulating film and another transparent electrically-conductive film can be provided on the second transparent electrically-conductive film, and thereby a further multilayer can be achieved in the transparent electrode. This means that at least one additional transparent insulating film and at least one additional transparent electrically-conductive film can be alternately provided on the second transparent electrically-conductive film, and thereby there can be provided a laminate structure in which a plurality of transparent electrically-conductive films and a plurality of transparent insulating films are alternately disposed on the supporting substrate. In other words, the transparent electrode with the further multilayered structure according to an embodiment of the present invention, includes a laminate structure in which a plurality of transparent electrically-conductive films and a plurality of transparent insulating films are alternately laminated on the supporting substrate, wherein all of the transparent electrically-conductive films and the transparent insulating films of the alternate laminate structure comprise a metal compound, and wherein the transparent electrically-conductive films have a crystalline structure, whereas the transparent insulating films have an amorphous structure.

Even in the case of the transparent electrode having such multilayered structure, the doping materials can be suitably different between the films, which will lead to an achievement of a higher degree of the design freedom in the transparent electrode.

It should be noted that the present invention as described above includes the following aspects.

First Aspect: A transparent electrode comprising:
a supporting substrate;
a first transparent electrically-conductive film provided on the supporting substrate;
a transparent insulating film provided on the first transparent electrically-conductive film; and
a second transparent electrically-conductive film provided on the transparent insulating film,
wherein all of the first transparent electrically-conductive film, the second transparent electrically-conductive film and the transparent insulating film provided therebetween comprise a metal compound, and
wherein the first transparent electrically-conductive film and the second transparent electrically-conductive film have a crystalline structure, whereas the transparent insulating film has an amorphous structure.

Second Aspect: The transparent electrode according to the first aspect, wherein a metal element, which constitutes the metal compound, is the same among the first transparent electrically-conductive film, the second transparent electrically-conductive film, and the transparent insulating film.

Third Aspect: The transparent electrode according to the first or second aspect, wherein the metal compound is a zinc compound.

Fourth Aspect: The transparent electrode according to the second or third aspect, wherein the first transparent electrically-conductive film and the second transparent electrically-conductive film at least comprise a zinc oxide, whereas the transparent insulating film at least comprises a zinc hydroxide.

Fifth Aspect: The transparent electrode according to any one of the first to fourth aspects, wherein the crystalline structure of the first transparent electrically-conductive film and the second transparent electrically-conductive film is in a form of needle.

Sixth Aspect: The transparent electrode according to the fifth aspect, wherein the crystalline structure in the form of needle is oriented in the direction perpendicular to the supporting substrate.

Seventh Aspect: The transparent electrode according to the fifth or sixth aspect when appendant to the fourth aspect, wherein the zinc hydroxide of the transparent insulating film is in a form of sphere.

Eighth Aspect: The transparent electrode according to any one of the first to seventh aspects, wherein each of the first transparent electrically-conductive film and the second transparent electrically-conductive film has a thickness of 2 μm or less.

Ninth Aspect: The transparent electrode according to any one of the first to eighth aspects, wherein at least one of the first transparent electrically-conductive film, the second transparent electrically-conductive film, and the transparent insulating film includes a Group IIIB element.

Tenth Aspect: The transparent electrode according to the ninth aspect, wherein the first transparent electrically-conductive film and the second transparent electrically-conductive film include the Group IIIB element.

Eleventh Aspect: The transparent electrode according to the tenth aspect, wherein the Group IIIB element of the first transparent electrically-conductive film and the Group IIIB element of the second transparent electrically-conductive film are different kind of element from each other.

Twelfth Aspect: The transparent electrode according to one of the first to eleventh aspects, wherein the first transparent electrically-conductive film and the second transparent electrically-conductive film have a patterned form.

Thirteenth Aspect: The transparent electrode according to one of the first to twelfth aspects, further comprising a gas barrier film between the supporting substrate and the first transparent electrically-conductive film.

Fourteenth Aspect: The transparent electrode according to one of the first to thirteenth aspects, wherein at least one additional transparent insulating film and at least one additional transparent electrically-conductive film are alternately provided on the second transparent electrically-conductive film, and thereby there is provided a laminate structure in which a plurality of transparent electrically-conductive films and a plurality of transparent insulating films are alternately provided on the supporting substrate.

Fifteenth Aspect: The transparent electrode according to any one of the first to fourteenth aspects, wherein the transparent electrode is one used for a touch panel.

Sixteenth Aspect: A method for manufacturing a transparent electrode, comprising sequentially applying a first transparent electrically-conductive film raw material, a transparent insulating film raw material, and a second transparent electrically-conductive film raw material with respect to a supporting substrate heated at a predetermined temperature to form a lamination of a first transparent electrically-conductive film, a transparent insulating film, and a second transparent electrically-conductive film on the supporting substrate, the method comprising the steps of:

(i) applying the first transparent electrically-conductive film raw material to the supporting substrate, and thereby the first transparent electrically-conductive film is formed on the supporting substrate;

(ii) applying the transparent insulating film raw material to the first transparent electrically-conductive film, and thereby the transparent insulating film is formed on the first transparent electrically-conductive film; and (iii) applying the second transparent electrically-conductive film raw material to the transparent insulating film, and thereby the second transparent electrically-conductive film is formed on the transparent insulating film, wherein all of the first transparent electrically-conductive film raw material, the transparent insulating film raw material and the second transparent electrically-conductive film raw material comprise an organic metal compound and an organic solvent, and wherein the first transparent electrically-conductive film and the second transparent electrically-conductive film, which are formed in the steps (i) and (iii), have a crystalline structure, whereas the transparent insulating film, which is formed in the step (ii), has an amorphous structure.

Seventeenth Aspect: The method according to the sixteenth aspect, a metal element, which constitutes the organic metal compound, is the same among the first transparent electrically-conductive film raw material, the second transparent electrically-conductive film raw material, and the transparent insulating film raw material.

Eighteenth Aspect: The method according to the sixteenth or seventeenth aspect, wherein an organic zinc compound is used as the organic metal compound.

Nineteenth Aspect: The method according to any one of the sixteenth to eighteenth aspects, wherein a heating temperature of the supporting substrate is changed between in the step (i) and in the step (ii), and between in the step (iii) and in the step (ii).

Twentieth Aspect: The method according to the nineteenth aspect, wherein the heating temperature of the supporting substrate is adjusted to a temperature of 100° C. or higher in the steps (i) and (iii), whereas the heating temperature of the supporting substrate is adjusted to a temperature of lower than 100° C. in the step (ii).

Twenty-First Aspect: The method according to the twentieth aspect, wherein the heating temperature of the supporting substrate in the steps (i) to (iii) is 200° C. or lower.

Twenty-Second Aspect: The method according to any one of the sixteenth to twenty-first aspects, wherein the applications of the first transparent electrically-conductive film raw material, the transparent insulating film raw material and the second transparent electrically-conductive film raw material are performed by a spray atomization.

Twenty-Third Aspect: The method according to the twenty-second aspect, wherein a spray nozzle for the spray atomization is used upon performing the spray atomization such that the spray nozzle is inclined with respect to the supporting substrate.

Twenty-Fourth Aspect: The method according to any one of the sixteenth to twenty-third aspects, further comprising the step of irradiating the first transparent electrically-conductive film with ultraviolet light, and/or the step of irradiating the second transparent electrically-conductive film with ultraviolet light.

Twenty-Fifth Aspect: The method according to any one of the sixteenth to twenty-fourth aspects, the method is one performed to manufacture the transparent electrode used for a touch panel.

INDUSTRIAL APPLICABILITY

The transparent electrode according to an embodiment of the present invention can be used for various devices. For example, it can be as a multilayered-structure electrode in which a higher light transmittance is required".

Figure 6:
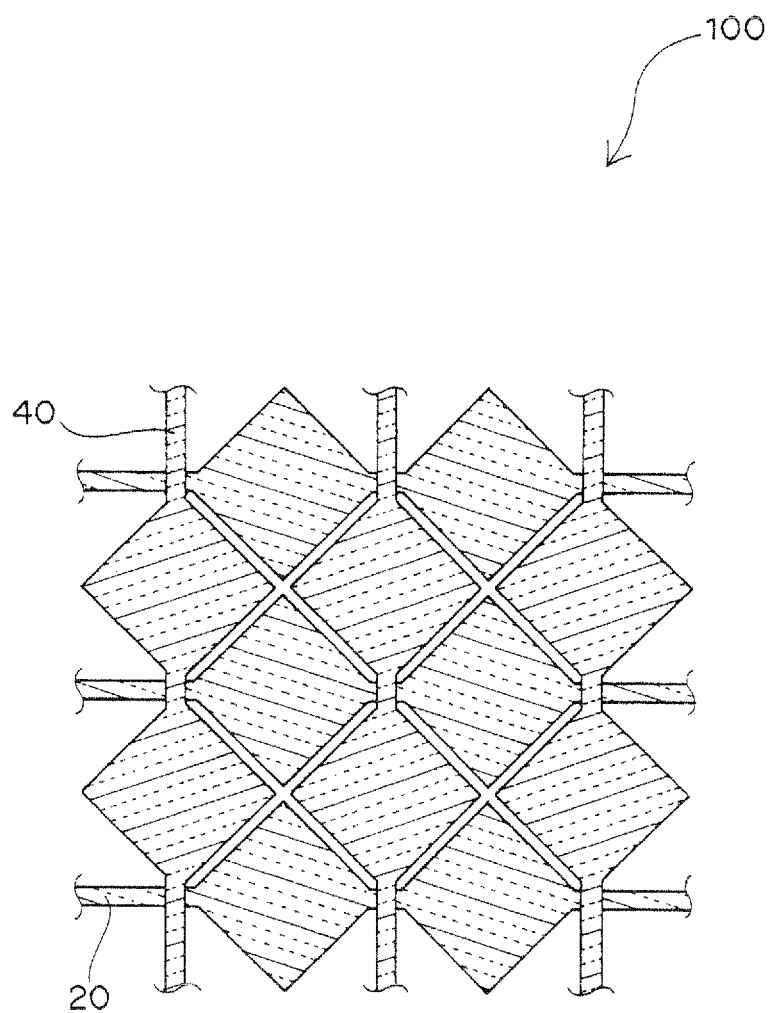
FIG. 6 is a top view schematically illustrating an embodiment of a transparent electrode used for a matrix-type touch panel.

More specifically, the electrode according to an embodiment of the present invention is particularly used as a transparent electrode for touch panel since it has a high reliability and a high light transmittance and is also excellent in its productivity. In a case where the transparent electrode is used for an electrostatic capacitive touch panel, the transparent electrode serving as a touch-panel electrode may have a matrix form in which the first transparent electrically-conductive thin film 20 and the second transparent electrically-conductive thin film 40 are provided in a form of matrix, as illustrated in FIG. 6. Furthermore, the transparent electrode according to an embodiment of the present invention can be suitably used in some particular field where the transparency is required similarly to the case of the touch panel. For example, the transparent electrode according to an embodiment of the present invention may be used for organic EL displays, electronic papers, solar batteries and the like.

CROSS REFERENCE TO RELATED PATENT APPLICATION

The present application claims the right of priority of Japan patent application No. 2012-128890 (filing date: Jun. 6, 2012, title of the invention: TRANSPARENT ELECTRODE AND METHOD FOR MANUFACTURING THE SAME), the whole contents of which are incorporated herein by reference.

REFERENCE NUMERALS

10 Supporting substrate
20 First transparent electrically-conductive film
20' Patterned first transparent electrically-conductive film
30 Transparent insulating film
40 Second transparent electrically-conductive film
40' Patterned second transparent electrically-conductive film
100 Transparent electrode (for example, transparent electrode used for touch panel)

The invention claimed is:

1. A transparent electrode comprising:
a supporting substrate;
a first transparent electrically-conductive film provided on the supporting substrate;
a transparent insulating film provided on the first transparent electrically-conductive film; and
a second transparent electrically-conductive film provided on the transparent insulating film,
wherein all of the first transparent electrically-conductive film, the second transparent electrically-conductive film and the transparent insulating film provided therebetween comprise a metal compound, and
wherein the first transparent electrically-conductive film and the second transparent electrically-conductive film have a crystalline structure, whereas the transparent insulating film has an amorphous structure.

2. The transparent electrode according to claim 1, wherein a metal element, which constitutes the metal compound, is the same among the first transparent electrically-conductive film, the second transparent electrically-conductive film, and the transparent insulating film.

3. The transparent electrode according to claim 1, wherein the metal compound is a zinc compound.

4. The transparent electrode according to claim 2, wherein the first transparent electrically-conductive film and the second transparent electrically-conductive film at least comprise a zinc oxide, whereas the transparent insulating film at least comprises a zinc hydroxide.

5. The transparent electrode according to claim 1, wherein the crystalline structure of the first transparent electrically-conductive film and the second transparent electrically-conductive film is in a form of needle.

6. The transparent electrode according to claim 5, wherein the crystalline structure in the form of needle is oriented in the direction perpendicular to the supporting substrate.

7. The transparent electrode according to claim 5, wherein the first transparent electrically-conductive film and the second transparent electrically-conductive film at least comprise a zinc oxide, whereas the transparent insulating film at least comprises a zinc hydroxide, and
wherein the zinc hydroxide of the transparent insulating film is in a form of sphere.

8. The transparent electrode according to claim 1, wherein each thickness of the first transparent electrically-conductive film and the second transparent electrically-conductive film is 2 μm or less.

9. The transparent electrode according to claim 1, wherein at least one of the first transparent electrically-conductive film, the second transparent electrically-conductive film, and the transparent insulating film includes a Group IIIB element.

10. The transparent electrode according to claim 9, wherein the first transparent electrically-conductive film and the second transparent electrically-conductive film include the Group IIIB element.

11. The transparent electrode according to claim 10, wherein the Group IIIB element of the first transparent electrically-conductive film and the Group IIIB element of the second transparent electrically-conductive film are different in their kinds from each other.

12. The transparent electrode according to claim 1, wherein the first transparent electrically-conductive film and the second transparent electrically-conductive film have a patterned form.

13. The transparent electrode according to claim 1, further comprising a gas barrier film between the supporting substrate and the first transparent electrically-conductive film.

14. The transparent electrode according to claim 1, wherein at least one additional transparent insulating film and at least one additional transparent electrically-conductive film are alternately provided on the second transparent electrically-conductive film, and thereby there is provided a lamination structure in which a plurality of transparent electrically-conductive films and a plurality of transparent insulating films are alternately disposed on the supporting substrate.

15. The transparent electrode according to claim 1, wherein the transparent electrode is used for a touch panel.

16. A method for manufacturing a transparent electrode, comprising sequentially applying a first transparent electrically-conductive film raw material, a transparent insulating film raw material, and a second transparent electrically-conductive film raw material with respect to a supporting substrate heated at a predetermined temperature to form a lamination of a first transparent electrically-conductive film, a transparent insulating film, and a second transparent electrically-conductive film on the supporting substrate, the method comprising the steps of:
(i) applying the first transparent electrically-conductive film raw material onto the supporting substrate, and thereby forming the first transparent electrically-conductive film on the supporting substrate;
(ii) applying the transparent insulating film raw material onto the first transparent electrically-conductive film, and thereby forming the transparent insulating film on the first transparent electrically-conductive film; and
(iii) applying the second transparent electrically-conductive film raw material onto the transparent insulating film, and thereby forming the second transparent electrically-conductive film on the transparent insulating film,
wherein all of the first transparent electrically-conductive film raw material, the transparent insulating film raw material and the second transparent electrically-conductive film raw material comprise an organic metal compound and an organic solvent, and
wherein the first transparent electrically-conductive film and the second transparent electrically-conductive film, which are to be formed in the steps (i) and (iii), have a crystalline structure, whereas the transparent insulating film, which is to be formed in the step (ii), has an amorphous structure.

17. The method according to claim 16, a metal element, which constitutes the organic metal compound, is the same among the first transparent electrically-conductive film raw material, the second transparent electrically-conductive film raw material, and the transparent insulating film raw material.

18. The method according to claim 16, wherein an organic zinc compound is used as the organic metal compound.

19. The method according to claim 16, wherein a heating temperature of the supporting substrate is changed between in the step (i) and in the step (ii), and between in the step (iii) and in the step (ii).

20. The method according to claim 19, wherein the heating temperature of the supporting substrate in the steps (i) and (iii) is adjusted to 100° C. or higher, whereas the heating temperature of the supporting substrate in the step (ii) is adjusted to lower than 100° C.

21. The method according to claim 20, wherein the heating temperature of the supporting substrate in the steps (i) to (iii) is 200° C. or lower.

22. The method according to claim 16, wherein the applications of the first transparent electrically-conductive film raw material, the transparent insulating film raw material and the second transparent electrically-conductive film raw material are performed by a spray atomization.

23. The method according to claim 22, wherein a spray nozzle is used in the spray atomization such that the spray nozzle is inclined with respect to the supporting substrate.

24. The method according to claim 16, further comprising the step of irradiating the first transparent electrically-conductive film with ultraviolet ray, and/or the step of irradiating the second transparent electrically-conductive film with ultraviolet ray.

25. The method according to claim 16, the method is performed to manufacture the transparent electrode used for a touch panel.

* * * * *